United States Patent [19]
Willems et al.

[11] Patent Number: 5,986,591
[45] Date of Patent: Nov. 16, 1999

[54] CONTEXT TREE ALGORITHM METHOD AND SYSTEM

[75] Inventors: Franciscus Maria Joannes Willems; Tjalling Jan Tjalkens, both of Geldrop, Netherlands

[73] Assignee: Koninklijke PTT Nederland N.V., Netherlands

[21] Appl. No.: 09/010,080

[22] Filed: Jan. 21, 1998

[30] Foreign Application Priority Data

Jan. 24, 1997 [EP] European Pat. Off. .............. 97200199

[51] Int. Cl.$^6$ ...................................................... H03M 7/00
[52] U.S. Cl. ............................................................ 341/79
[58] Field of Search .................. 341/79, 50, 51, 341/106, 107

[56] References Cited

U.S. PATENT DOCUMENTS

| | | |
|---|---|---|
| 4,286,256 | 8/1981 | Langdon, Jr. et al. . |
| 4,494,108 | 1/1985 | Langdon, Jr. et al. . |
| 5,023,611 | 6/1991 | Chamzas et al. . |
| 5,025,258 | 6/1991 | Duttweiler . |
| 5,298,896 | 3/1994 | Lei et al. . |
| 5,357,250 | 10/1994 | Healey et al. . |
| 5,534,861 | 7/1996 | Chang et al. . |
| 5,689,256 | 11/1997 | Elnathan ................................... 341/79 |
| 5,694,128 | 12/1997 | Kim ........................................ 341/79 |

FOREIGN PATENT DOCUMENTS 0 480 115   4/1992   European Pat. Off. .

OTHER PUBLICATIONS

F.M.J. Willems et al, "The Context–Tree Weighting Method: Basic Properties", *IEEE Transactions on Information Theory*, vol. 41, No. 3, May 1995, pp. 653–664.

*Primary Examiner*—Brian Young
*Attorney, Agent, or Firm*—Michaelson & Wallace; Peter L. Michaelson

[57] ABSTRACT

Known methods for construct a tree, for a context tree algorithm for coding symbols, construct trees by adding nodes. These methods need a giant memory capacity, which can be reduced in case unnecessary nodes are not added to the tree. This should be done through dependence on values of parameters belonging to a node where each parameter defines a number of symbols received that have a certain value.

10 Claims, 2 Drawing Sheets

CONTEXT TREE ALGORITHM METHOD AND SYSTEM

A BACKGROUND OF THE INVENTION

The invention relates to a method for constructing a tree for a context tree algorithm for coding symbols, which method comprises the steps of:

-x- in dependence of a value of a symbol to be coded, adapting a value of either a first parameter or a second parameter, which values correspond to a node of said tree, -y- in dependence of a value of a previous symbol, in case the node is preceded by a previous node, continuing with step -x- for the previous node, and -z- in dependence of a value of a previous symbol, in case the node is not preceded by a previous node, creating another previous node and continuing with step -x- for said other previous node.

Such a method is known from IEEE Transactions on INFORMATION THEORY, May 1995, Volume 41, Number 3, in particular "The Context-Tree Weighting Method: Basic Properties", by F. M. J. Willems, Y. M. Shtarkov and T. J. Tjalkens, pages 653–664, which article discloses a sequential universal data compression procedure for binary tree sources. By using a context tree, this procedure weights in an efficient recursive way the coding distributions corresponding to all bounded memory tree sources, and achieves a desirable coding distribution for tree sources with an unknown model and unknown parameters.

Such a method is disadvantageous because it needs a giant memory capacity.

B SUMMARY OF THE INVENTION

It is an object of the invention, inter alia, to provide a method as defined in the preamble, which method needs less memory capacity.

Thereto, the method according to the invention is characterised in that, in dependence of at least one value of the parameters, the other previous node is created or is not created.

By, through dependence of at least one value of the parameters, preventing the creation of the other previous node in case this is not necessary, a more efficient a tree is constructed, which saves memory capacity.

The invention is based, inter alia, on the insight that it is not necessary to create each possible node.

The problem of known methods needing a giant memory capacity is solved by making the creation of a node dependent upon at least one value of the parameters for preventing the creation of unnecessary nodes.

It should be observed that the method according to the invention is neither restricted to context tree weighting algorithms nor to binary tree sources, the method according to the invention can be used for constructing a tree for a context tree algorithm for coding symbols, which symbols each can have at least two symbol values.

A first embodiment of the method according to the invention is characterized in that the first parameter is $a(n)$ and the second parameter is $b(n)$, the values of these parameters corresponding to the node n, the other previous node being created in case $a(n)>0$ and $b(n)>0$.

According to this first embodiment, in case at least either $a(n)=0$ or $b(n)=0$ the other previous node is not created, which saves memory capacity. According to an alternative embodiment, the other previous node is, for example, not created in case $a(n)<2$ and $b(n)<2$, or is for example not created in case $a(n)/b(n)<0.001$ or $a(n)/b(n)>1000$.

A second embodiment of the method according to the invention is characterized in that a third parameter $i(n)$ defines the node being preceded or not being preceded by a previous node, the creation of the other previous node comprising the definition of a fourth parameter $j$ being an index of the other previous node, with $a(j)$ and $b(j)$ being initiated, with $i(j)$ getting the value 0, with $i(n)$ getting the value $j$, and with n getting the value $i(n)$.

A less efficient but accurate way of initializing $a(j)$ and $b(j)$ could, for example, be realized by using stored values of previous symbols.

A third embodiment of the method according to the invention is characterized in that, during initializing, $a(j)$ gets the value 0 and $b(j)$ gets the value 0.

An efficient but less accurate way of initializing $a(j)$ and $b(j)$ could, for example, be $a(j)=b(j)=0$.

A fourth embodiment of the method according to the invention is characterised in that the method comprises a step being situated between step -x- on the one hand and steps -y- and -z- on the other hand of:

-w- a fifth parameter d being adapted for each further node and being compared with a threshold value D after each adaptation.

By introducing the fifth parameter d and comparing it with the threshold value D the method for constructing a tree is limited for trees having a maximum depth being equal to the threshold value D.

The invention further relates to a system for constructing a tree for a context tree algorithm for coding symbols, which system comprises processor means and memory means for storing, at first locations belonging to a node, values of parameters and for storing, at second locations belonging to a previous node, values of parameters and for storing at third locations, belonging to another previous node, values of parameters, the processor means comprising adaptation means for, in dependence of a value of a symbol to be coded, adapting a value of either a first parameter or a second parameter, which values are stored at at least two of said first locations, comparison means for, through dependence of a value of a previous symbol, comparing a value of a third parameter, which value is stored at at least one of the first locations, with a prefixed value, whereby, in case of a first comparison result, a value of either a first parameter or a second parameter is adapted, which values are stored at at least two of the second locations, through dependence of a value of a symbol to be coded, by using the adaptation means, and allocation means for, in case of a second comparison result, in dependence of a value of a previous symbol, allocating a value to a fourth parameter, which value is stored at at least one of the third locations, whereby, a value of either a first parameter or a second parameter is adapted, which values are stored at at least two of the third locations, through dependence of a value of a symbol to be coded, by using the adaptation means.

Such a system is disadvantageous because it needs a giant memory capacity.

It is a further object of the invention, inter alia, to provide a system as defined above, which system needs less memory capacity.

Thereto, the system according to the invention is characterized in that the processor means comprise check means for checking at least one value of at least of the first and second parameters for, in case of a first check result, activating said allocation means and for, in case of a second check result, deactivating the allocation means.

A first embodiment of the system according to the invention is characterized in that the first parameter is a(n) and the second parameter is b(n), the values of these parameters being stored at the at least two of the first locations, with $a(n)>0$ and $b(n)>0$ resulting in the first check result, and with other cases resulting in the second check result.

A second embodiment of the system according to the invention is characterized in that the third parameter is i(n) and the fourth parameter is j, with a(j) and b(j) being initialized, with i(j) getting the value 0, with i(n) getting the value j, and with n getting the value i(n).

A third embodiment of the system according to the invention is characterized in that, during initialized, a(j) gets the value 0 and b(j) gets the value 0.

A fourth embodiment of the system according to the invention is characterized in that the processor means comprise
further adaptation means for adapting a fifth parameter d after each adaptation of the value of either the first parameter or said second parameter, and
further comparison means for comparing said fifth parameter d with a threshold value D after each further adaptation.

C REFERENCES

IEEE Transactions on INFORMATION THEORY, May 1995, Volume 41, Number 3, in particular "The Context-Tree Weighting Method: Basic Properties", by F. M. J. Willems, Y. M. Shtarkov and T. J. Tjalkens, pages 653–664
EP 96202007.9 (priority/filing date Jul. 15, 1996)
U.S. Pat. No. 5,534,861
EP 0 480 115
U.S. Pat. No. 5,023,611
U.S. Pat. No. 5,025,258
U.S. Pat. No. 4,286,256
U.S. Pat. No. 4,494,108
U.S. Pat. No. 5,357,250
All references are incorporated by reference herein.

BRIEF DESCRIPTION OF THE DRAWING

The invention will be explained at the hand of an embodiment shown in the figures.

DETAILED DESCRIPTION

Figure 1:
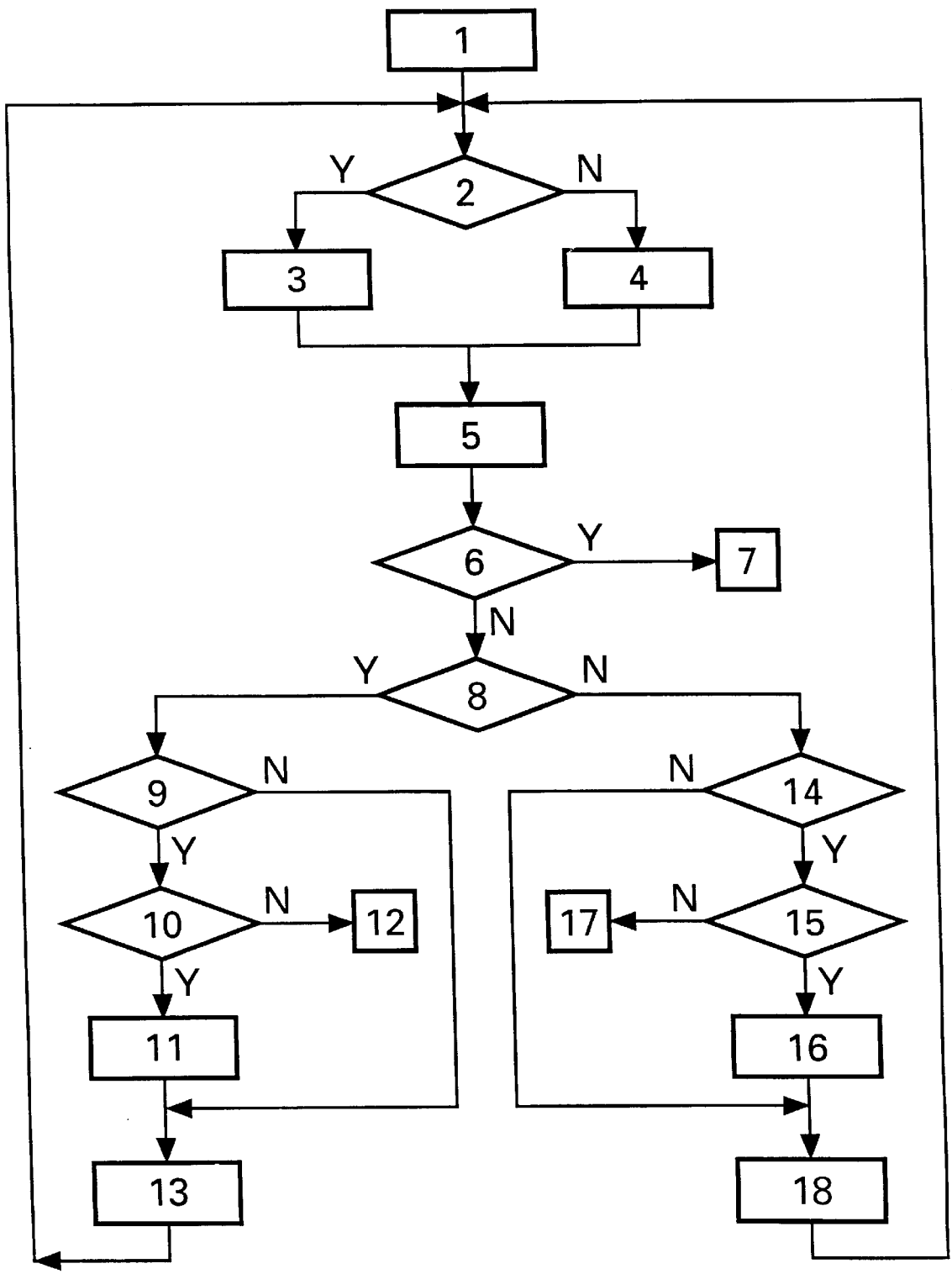
FIG. 1 a flow chart illustrating the method according to the invention.

The flow chart depicted in FIG. 1 comprises blocks having the following meaning:
block 1
  n:=1
  x:=x(t)
  d:=0
  go to block 2
block 2
  is x=0?
  if yes, go to block 3
  if no, go to block 4
block 3
  a(n):=a(n)+1
  go to block 5
block 4
  b(n):=b(n)+1
  go to block 5
block 5
  d:=d+1
  go to block 6
block 6
  is d>D?
  if yes, go to block 7
  if no, go to block 8
block 7
  stop further construction tree for x(t)
block 8
  is x(t-d)=0?
  if yes, go to block 9
  if no, go to block 14
block 9
  is $i_0(n)=0$?
  if yes, go to block 10
  if no, go to block 13
block 10
  is $a(n)>0$ and $b(n)>0$?
  if yes, go to block 11
  if no, go to block 12
block 11
  j:=index new node
  a(j):=0
  b(j):=0
  $i_0(j):=0$
  $i_1(j):=0$
  $i_0(n):=j$
  go to block 13
block 12
  stop further construction tree for x(t)
block 13
  $n:=i_0(n)$
  go to block 2
block 14
  is $i_1(n)=0$?
  if yes, go to block 15
  if no, go to block 18
block 15
  is $a(n)>0$ and $b(n)>0$?
  if yes, go to block 16
  if no, go to block 17
block 16
  j:=index new node
  a(j):=0
  b(j):=0
  $i_0(j):=0$
  $i_1(j):=0$
  $i_1(n):=j$
  go to block 18
block 17 stop further construction tree for x(t)
block 18
n:=$i_1(n)$
go to block 2

The method according to the invention, in view of the flow chart depicted in FIG. 1, operates as follows. In response to a received symbol x(t), x gets the value of x(t), n gets the value one (indicating the root of the tree) and a fifth parameter d gets the value zero (block 1). In case of a binary embodiment, x(t) will have either the value one or the value zero. In case x=0, a first parameter a(n) is increased with the value one, and in case x=1 a second parameter b(n) is increased with the value one (blocks 2,3,4). Then, the fifth parameter d is increased with the value one (block 5), after which the increased fifth parameter d is compared with a threshold value D (block 6). In case d>D, the method is stopped (block 7), otherwise a value of a previous symbol x(t-d) is compared with the value zero (block 8). In case x(t-d)=0, a third parameter $i_0(n)$ is compared with the value zero (block 9). In case $i_0(n)$=0 (indicating that the node is not preceded by a previous node) the values of the first parameter a(n) and of the second parameter b(n) are compared with the value zero (block 10). If it is not true that a(n)>0 and b(n)>0, the method is stopped (block 12), otherwise a fourth parameter j gets a value being an index of another previous node (a new node), the first parameter a(j) gets the value zero, the second parameter b(j) gets the value zero, the third parameter $i_0(j)$ gets the value zero and the third parameter $i_1(j)$ gets the value zero (indicating that, due to the creation of the other previous node, this other previous node is not preceded by further nodes), and the third parameter $i_0(n)$ gets the value of the fourth parameter j (block 11). Then n gets the value of the third parameter $i_0(n)$ (block 13). In case $i_0(n)$>0 (indicating that the node is preceded by a previous node) (block 9) n also gets the value of the third parameter $i_0(n)$ (block 13), but without the adaptation of the fourth parameter j, etc. Then the method is repeated, starting with block 2. In case x(t-d)=1, a third parameter $i_1(n)$ is compared with the value zero (block 14). In case $i_1(n)$=0 (indicating that the node is not preceded by a previous node) the values of the first parameter a(n) and of the second parameter b(n) are compared with the value zero (block 15). If it is not true that a(n)>0 and b(n)>0, the method is stopped (block 17), otherwise a fourth parameter j gets a value being an index of another previous node (a new node), the first parameter a(j) gets the value zero, the second parameter b(j) gets the value zero, the third parameter $i_0(j)$ gets the value zero, the third parameter $i_1(j)$ gets the value zero (indicating that, due to the creation of the other previous node, this other previous node is not preceded by further nodes), and the third parameter $i_1(n)$ gets the value of the fourth parameter j (block 16). Then, n gets the value of the third parameter $i_1(n)$ (block 18). In case $i_1(n)$>0 (indicating that said node is preceded by a previous node) (block 14) n also gets the value of the third parameter $i_1(n)$ (block 18), but without the adaptation of the fourth parameter j, etc. Then the method is repeated, starting with block 2.

In general, the method for constructing a tree for a context tree algorithm for coding symbols comprises the steps of:

-x- in dependence of a value of a symbol x(t) to be coded, adapting a value of either a first parameter a(n) or a second parameter b(n), which values correspond to a node of the tree (blocks 1,2,3,4,5), -y- in dependence of a value of a previous symbol x(t-d), in case said node is preceded by a previous node, continuing with step -x- for said previous node (blocks 8,9,13 or 8,14,18), and -z- in dependence of a value of a previous symbol, in case the node is not preceded by a previous node, creating another previous node and continuing with step -x- for the other previous node (blocks 8,9,11,13 or 8,14,16, 18), and is characterized in that, by dependence on at least one value of the parameters, the other previous node is created or is not created (blocks 10,11,12 or 15,16,17), which will save memory capacity.

According to a first embodiment the method is characterized in that the other previous node is created in case a(n)>0 and b(n)>0 (blocks 10,11 or 15,16). According to an alternative embodiment, the other previous node is, for example, not created in case a(n)<2 and b(n)<2, or is, for example, not created in case a(n)/b(n)<0.001 or a(n)/b(n) >1000.

According to a second embodiment the method is characterized in that a third parameter i(n) defines the node being preceded or not being preceded by a previous node, the creation of the other previous node comprising the definition of a fourth parameter j being an index of the other previous node, with a(j) and b(j) being initialized, with i(j) getting the value 0, with i(n) getting the value j, and with n getting the value i(n) (blocks 9,11 or 14,16). A less efficient but accurate way of initializing a(j) and b(j) could, for example be realized by using stored values which have been found earlier.

According to a third embodiment the method is characterized in that, during initialization, a(j) gets the value 0 and b(j) gets the value 0 (block 11 or 16). This is an efficient but less accurate way of initializing a(j) and b(j).

According to a fourth embodiment the method is characterized in that the method comprises a step being situated between step -x- on the one hand and steps -y- and -z- on the other hand of:

-w- a fifth parameter d being adapted for each further node and being compared with a threshold value D after each adaptation (block 6). By introducing the fifth parameter d and comparing it with the threshold value D the method for constructing a tree is limited for trees having a maximum depth being equal to the threshold value D.

Figure 2:
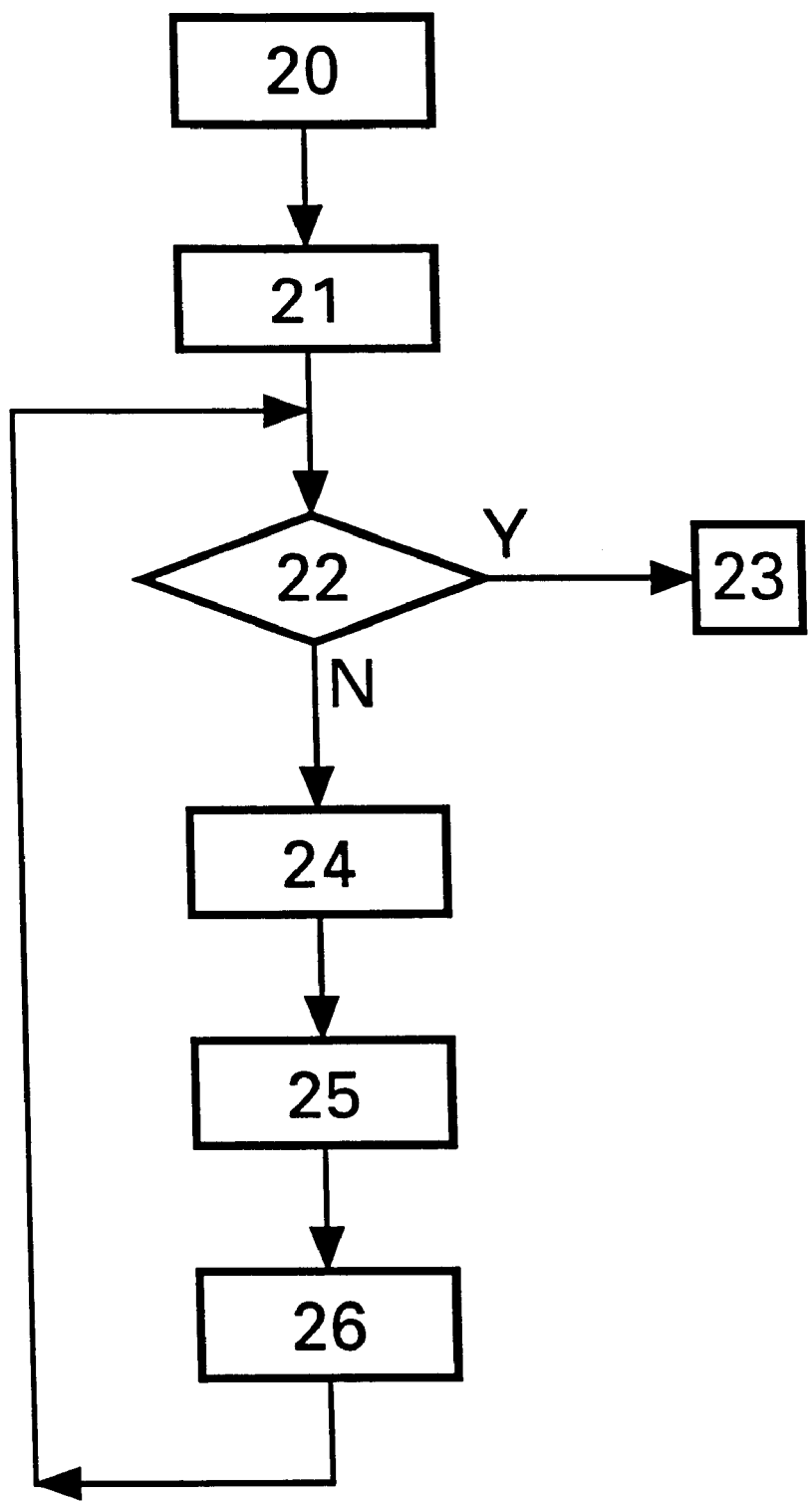
FIG. 2 a flow chart illustrating a context tree algorithm based on the method according to the invention.

The flow chart depicted in FIG. 2 comprises blocks having the following meaning:
block 20
 a(1):=0
 b(1):=0
 $i_0$(1):=0
 $i_1$(1):=0
 go to block 21
block 21
 t:=1
 go to block 22
block 22
 is t>T?
 if yes, go to block 23
 if no, go to block 24
block 23
 stop
block 24
 statistical calculation and coding of x(t)
 go to 25
block 25
 further construction of the tree for x(t)
 go to 26 block 26 t:=t+1 go to block 22

In view of the flow chart depicted in FIG. 1, the following operations are performed. The first parameter a(1) and the second parameter b(1) get the value zero (n=1 corresponding with the root of the tree), and the third parameter $i_0(1)$ and the third parameter $i_1(1)$ get the value zero (block 20). Then a sixth parameter t gets the value one (block 21), after which the value of the sixth parameter t is compared with a further threshold value T (block 22): in case t>T, there are no more operations (block 23), otherwise the statistical calculations and the coding of x(t) are performed (block 24), which for example is disclosed in IEEE Transactions on INFORMATION THEORY, May 1995, Volume 41, Number 3, in particular "The Context-Tree Weighting Method: Basic Properties", by F. M. J. Willems, Y. M. Shtarkov and Tj. J. Tjalkens, pages 653–664 and in EP 96202007.9 (priority/filing date Jul. 15, 1996). Then, the tree is further constructed for the received symbol x(t), which construction is further disclosed in FIG. 1 (block 25). Finally, the value of the sixth parameter t is increased with the value one (block 26), after which the operations are repeated, starting with block 22.

We claim:

1. A method for constructing a tree for a context tree algorithm for coding symbols, the method comprising the steps of:

(x) adapting a value of one parameter in a plurality of parameters, the plurality of parameters having first and second parameters, said one parameter being selected from among the plurality of parameters in response to a value of a symbol to be coded, the value of the first or the second parameter corresponding to a node of said tree;

(y) if said node is preceded by a first previous node, continuing with step x for said first previous node; and (z) if said node is not preceded by the first previous node, creating a second previous node and continuing with step x for the second previous node such that the second previous node is created or not in response to at least one value of said parameters.

2. The method according to claim 1, wherein the first parameter is a(n) and the second parameter is b(n), the values of a(n) and b(n) correspond to said node n, further comprising the step of creating said second previous node if a(n)>0 and b(n)>0.

3. The method according to claim 2, wherein a third parameter i(n) defines node n being preceded or not by the first previous node, said creating step comprising the step of defining a fourth parameter j as an index of the second previous node, with a(j) and b(j) being initialized such that i(j) is set to a value 0, i(n) is set to the value j, and n is set to the value i(n).

4. The method according to claim 3, wherein, during initializing, a(j) is set to the value 0 and b(j) is set to the value 0.

5. The method according to claim 1, further comprising the step, situated between step x, and collectively steps y and z, of:

(w) adapting a fifth parameter d for each further node and comparing parameter d with a threshold value D after each adaptation to yield a comparison result, in which case, based on the comparison result, either step w is followed by steps y and z, or no second previous node is created.

6. A system for constructing a tree for a context tree algorithm for coding symbols, which system comprises processor means and memory means for storing values of corresponding parameters at first locations belonging to a node, second locations belonging to a first previous node and third locations belonging to a second previous node, said processor means comprising:

adaptation means for adapting a value of one parameter out of a plurality of parameters, the plurality of parameters having first and second parameters, said one parameter being selected from among the plurality of parameters in response to a value of a symbol to be coded, the values of the first and the second parameters being stored at at least two of said first locations;

comparison means for comparing a value of a third parameter, the value of the third parameter being stored at at least one of said first locations, with a prefixed value so as to yield first or second comparison results, such that, in response to the first comparison result, a value of either the first or the second parameters are adapted, by use of the adaptation means, to yield the first or second parameters, respectively, which are stored at at least two of said second locations; and allocation means for allocating, in response to the second comparison result, a value to a fourth parameter, wherein the value of the fourth parameter is stored at at least one of said third locations, and adapting a value of either the first or the second parameters, by use of the adaptation means, to yield the first or second parameters, respectively, which are stored at at least two of said third locations; and wherein the processor means comprise:

check means for checking at least one value of at least one of said first and second parameters so as to yield first or second check results, such that, in response to the first check result, said allocation means are activated in order to create the second previous node and, in response to the second check result, said allocation means are deactivated so that the second previous node is not created.

7. The system according to claim 6, wherein the first parameter is a(n) and the second parameter is b(n), the values of the first and second parameters are stored at said at least two of said first locations, and wherein if a(n)>0 and b(n)>0 then said first check result occurs and, if not, then said second check result occurs.

8. The system according to claim 7, wherein the third parameter is i(n) and the fourth parameter is j, with a(j) and b(j) being initialized such that i(j) is set to the value 0, i(n) is set to the value j and with n is set to the value i(n).

9. The system according to claim 8, wherein, during initializing, a(j) is set to the value 0 and b(j) is set to the value 0.

10. The system according to claim 6, wherein said processor means comprise:

further adaptation means for adapting a fifth parameter d after each adaptation of said value of either said first parameter or said second parameter; and further comparison means for comparing said fifth parameter d with a threshold value D after each adaptation of the fifth parameter.

\* \* \* \* \*